US006581172B2

(12) United States Patent
Totorica et al.

(10) Patent No.: US 6,581,172 B2
(45) Date of Patent: *Jun. 17, 2003

(54) ON-BOARD TESTING CIRCUIT AND METHOD FOR IMPROVING TESTING OF INTEGRATED CIRCUITS

(75) Inventors: Robert L. Totorica, Boise, ID (US); Charles K. Snodgrass, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 272 days.

This patent is subject to a terminal disclaimer.

(21) Appl. No.: 09/764,568

(22) Filed: Jan. 16, 2001

(65) Prior Publication Data

US 2001/0005896 A1 Jun. 28, 2001

Related U.S. Application Data

(63) Continuation of application No. 09/113,940, filed on Jul. 10, 1998, now Pat. No. 6,192,495.

(51) Int. Cl.$^7$ .............................................. G11C 29/00
(52) U.S. Cl. ..................... 714/718; 714/30; 714/724; 714/733; 714/734; 324/158.1
(58) Field of Search .............................. 714/718, 724, 714/733, 734, 30; 324/158.1, 765

(56) References Cited

U.S. PATENT DOCUMENTS 5,497,079 A * 3/1996 Yamada et al. .......... 324/158.1
5,748,644 A * 5/1998 Szabo ....................... 714/733

* cited by examiner

Primary Examiner—Emmanuel L. Moise
(74) Attorney, Agent, or Firm—Dorsey & Whitney, LLP

(57) ABSTRACT

A system allowing testing a plurality of integrated circuits mounted on a common substrate is described. The testing system includes a failure processor mounted on the substrate. The substrate has a first signal port adapted to be coupled to a testing device. The failure processor has a second signal port coupled to the first signal port and a plurality of test ports corresponding in number to the number of integrated circuits mounted on the substrate that are to be tested. Each of the test ports may be coupled to a respective one of the integrated circuits. The failure processor is constructed to apply stimulus signals to each of the integrated circuits and to record response signals generated by each of the integrated circuits in response to the stimulus signals provided to the integrated circuits. The failure processor is further constructed to provide report data based on the response signals and to couple the report data from the second signal port to the first signal port. As a result, many integrated circuits under test may share the first signal port through the failure processor, because the integrated circuits under test are not providing output data on the first signal port to an external test data evaluation apparatus. The efficiency with which integrated circuits may be tested is thereby increased.

22 Claims, 5 Drawing Sheets

ON-BOARD TESTING CIRCUIT AND METHOD FOR IMPROVING TESTING OF INTEGRATED CIRCUITS

CROSS-REFERENCE TO RELATED APPLICATION

This application is a continuation of U.S. patent application Ser. No. 09/113,940, filed Jul. 10, 1998 now U.S. Pat. No. 6,192,495.

TECHNICAL FIELD

The present invention relates generally to testing of integrated circuits, and more specifically to a method and apparatus that reduces the time and testing resources needed for testing of memory integrated circuits.

BACKGROUND OF THE INVENTION

Integrated circuits are extensively tested both during and after production, and, in some cases, routinely during use after they have been installed in products. For example, memory devices, such as dynamic random access memories ("DRAMs"), are tested during production at the wafer level and after packaging, and they are also routinely tested each time a computer system using the DRAMs executes a power-up or "boot" routine when power is initially applied to the computer system. As the capacity of DRAMs and other memory devices continues to increase, the time require to test the DRAMs continues to increase, even though memory access times continue to decrease.

A typical RAM integrated circuit includes at least one array of memory cells arranged in rows and columns. Each memory cell must be tested to ensure that it is operating properly. In a typical prior art test method, data having a first binary value (e.g., a "1") are written to and read from all memory cells in the arrays, and thereafter data having a second binary value (e.g., a "0") are typically written to and read from the memory cells. A memory cell is determined to be defective when the date that is read from the memory cell does not equal the data that was written to the memory cell. As understood by one skilled in the art, other test data patterns may be utilized in testing the memory cells, such as an alternating bit pattern, e.g., 101010 . . . , written to the memory cells in each row of the arrays.

One situation requiring testing of memory integrated circuits occurs during fabrication of memory integrated circuits. Fabrication yields are reduced when fabrication errors occur. Testing of memory integrated circuits during fabrication allows the sources of some fabrication errors to be promptly identified and corrected.

Another situation requiring testing of integrated circuits also occurs in fabrication of memory integrated circuits. Defective memory cells are identified by testing and are replaced with non-defective memory cells from a set of spare or redundant memory cells. In one conventional method for replacing defective memory cells, fuses on the integrated circuit are blown in a pattern corresponding to the addresses of defective memory cells. The pattern is then read to select redundant memory cells to replace the defective memory cells.

FIG. 1 is a simplified block diagram of several integrated circuit memory devices 10 and an automated tester 12 according to the prior art. Separate buses 14 couple each of the memory devices 10 on a circuit board 16 to the automated tester 12 through a connector 18. The buses 14 convey stimuli, such as write data, from the automated tester 12 to the memory devices 10 that are being tested. Transmission of the write data to the memory devices 10 does not require separate buses 14 because the same data are typically written to all of the memory devices 10.

Each memory device 10 generates a response, such as read data, from the data that are written to that memory device 10. The buses 14 convey the read data from each memory device 10 back to the automated tester 12. The automated tester 12 compares the read data from each memory device 10 to expect data, which correspond to the write data. The expect data thus correspond to read data that would be provided by the memory device 10 if it was operating properly. When the read data and the corresponding expect data match, the memory device 10 is considered to be functioning normally. When the read data do not match the corresponding expect data, the memory device 10 is considered to be malfunctioning.

If the memory devices 10 are read at the same time. transmission of the read data from the memory devices 10 requires separate buses 14 because read data resulting from failures in one or more of the memory devices will differ from each other. When these differing read data are transmitted over a common bus, contention between the differing data results in ambiguity as to which memory device 10 provided the read data corresponding to the defective memory cell and may also result in ambiguity in determining the data that are present on the bus 14. The automated tester 12 must therefore read data from each of the memory devices 10 individually. As a result, reading data from the memory device 10 requires more time than does writing to the memory devices 10. The requirement that data be read from each memory device 10 individually results in relatively long test times. Yet test time is a significant cost factor for manufacturers of memory devices 10. Additionally, since longer tests increase the number of automatic testers required to test a given number of memory devices 10, the cost of testing in further increased, particularly since automated testers 12 may cost several million dollars apiece.

Testing times may be minimized by testing multiple memory devices 10 at the same time. However, each automated tester 12 can only accommodate a finite number of buses 14, thereby limiting the number of memory devices 10 that may be simultaneously tested. The number of memory devices 10 that may be simultaneously coupled to the automated tester 12 is known as the "fanout" for the automated tester 12. One factor limiting fanout for each automated tester 12 involves the connector 18 that couples the circuit board 16 holding the memory devices 10. A practical upper limit for the number of pins on each connector 18 is about 300. Larger numbers of pins tend to result in connectors 18 that are not sufficiently reliable. As a result, the number M of memory devices 10 that can be simultaneously tested is limited to about 300/N, where N is the number of connections that an be made to each memory device 10. For example, an automated tester 12 having a capacity of about 300 data lines may be employed to simultaneously test, without data compression, two memory devices 10 having 128 bit wide data buses, or four memory devices 10 having 64 bit wide data buses. With data compression, the same automated tester 12 may test, for example, sixteen (or possibly even up to eighteen) memory sevices 10, but will only be able to receive 16 bits of read data from each memory device 10.

In any of these cases, the time required to analyze the read data obtained by testing the memory devices 10 often exceeds the time required to perform the tests. The time needed to analyze the test results may decrease when data compression is used, but the results of testing done using data compression may be ambiguous or may not be useful for some purposes. For example, testing using data compression may be incapable of identifying a specific faulty memory cell but instead may be capable of identifying only a group, e.g., a row or column, of memory cells containing the defective memory cell.

As a result, data compression tests tend to be "go/no-go" tests for a given memory device 10 as a whole, rather than diagnostic tests providing detailed information (e.g., addresses) regarding specific defective memory cells. However, data compression tests may be used to replace groups of rows or columns when the compressed data show that at least one of the rows or columns in the memory array includes one or more defects.

While compressed data do not always support the repair operations described above, they are extremely useful for other test purposes because they greatly speed testing. These other test purposes include speed grading (i.e., determining the maximum clock frequency permitting reliable operation) of memory device 10.

In speed grading, the number of failures is relevant, and some inaccuracy in the measured number of failures may be quite acceptable. The number of failures measured in a test using read data compression is a lower bound for the total number of failures that occurred during the test because it is frequently impossible to determine from the compresses data when multiple failures result in a failure in the same compressed read bit location at the same time.

There are therefore needs to reduce the time required to test memory devices and to increase the fanout for automated testers.

SUMMARY OF THE INVENTION

In one aspect of the present invention, a test circuit for testing of multiple memory devices includes failure processors for collecting read data from memory devices that are being tested. The failure processor then compares the read data to corresponding expect data to provide failure data describing failures that have occurred in the memory devices that are being tested. The failure processors may store the failure data until an automated tester polls the failure processors to download the stored failure data. As a result, the amount of data flowing from the circuit board to the automated tester is reduced, decreasing the time required to test the memory devices.

In another aspect of the invention, the failure processor also includes capabilities for analyzing the failure data to provide a post-analysis dataset that is much more compact than either the test data or the failure data. The failure data from many memory integrated circuits may be analyzed in real time by an ensemble of distributed failure processors, rather than by a central processor located in the automated tester. In one aspect of the invention, the automated tester sequentially polls the failure processors to download post-analysis datasets. Downloading post-analysis datasets requires substantially less time than downloading test or failure data because the post-analysis dataset is more compact than either the test or the failure data.

Testing of memory integrated circuits is thereby facilitated, reducing the time required for testing memory devices and increasing the fanout from automated testers.

DETAILED DESCRIPTION OF THE INVENTION

Figure 1:
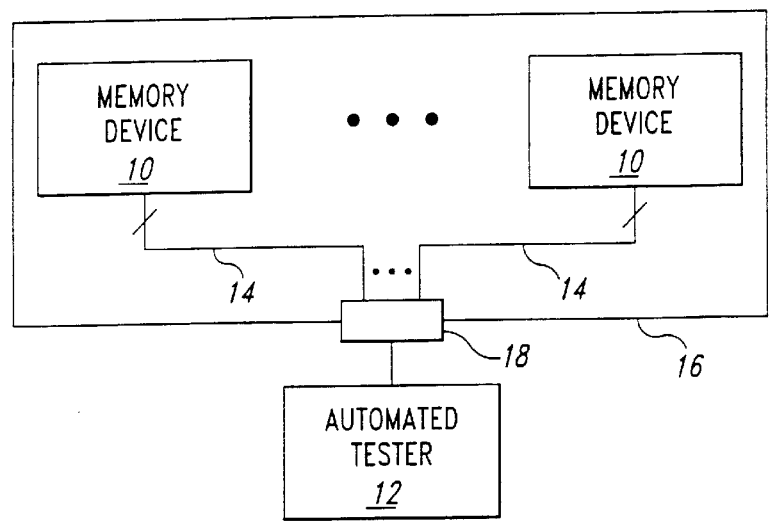
FIG. 1 is a simplified block diagram of several memory devices and an automated tester according to the prior art.
Figure 2:
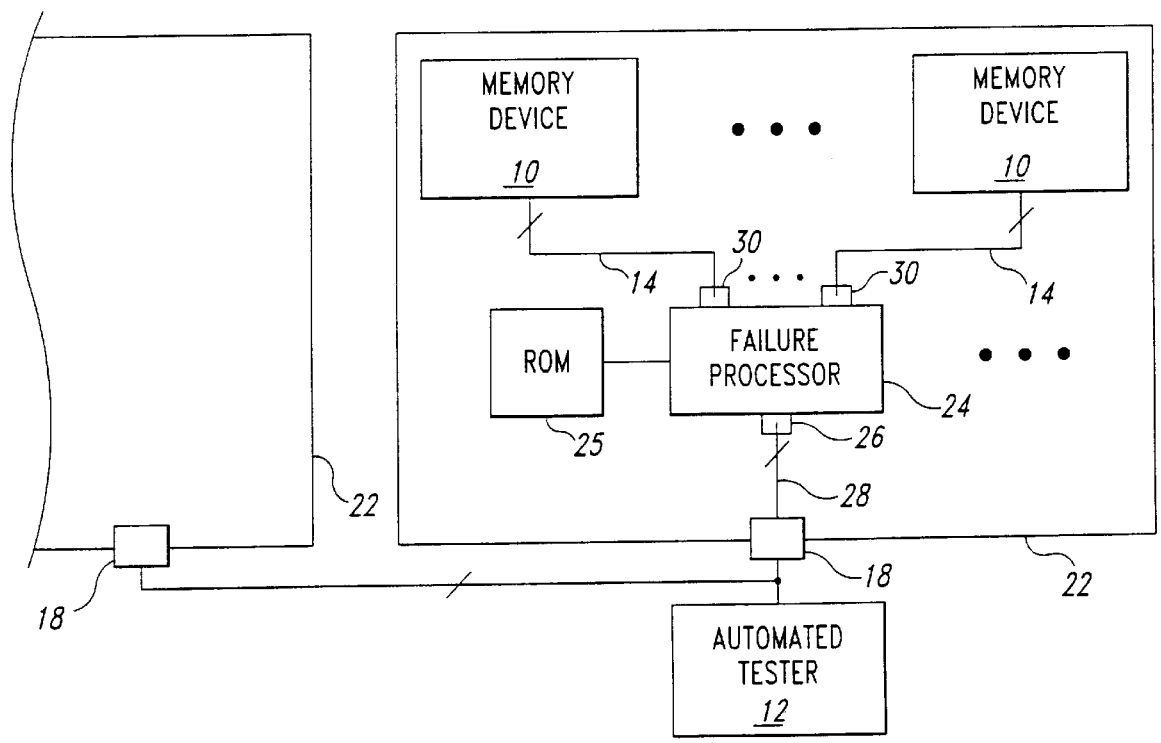
FIG. 2 is a simplified block diagram of several memory devices mounted on a test circuit board in accordance with an embodiment of the present invention.

FIG. 2 is a simplified block diagram of several memory devices mounted on test circuit boards 22 in accordance with an embodiment of the present invention. Many of the components shown in FIG. 2 are the same as those shown in FIG. 1. Thus, for purposes of clarity and brevity, these components have been provided with the same reference numerals, and a detailed explanation of their operation will not be repeated. It will be understood by those of ordinary skill in the relevant arts that while this discussion is presented in terms of testing of integrated memory devices 10, other types of integrated circuits, such as microprocessor circuits, may also be tested as described herein.

The test circuit board 22 includes one or more failure processors 24 and may include an optional ROM 25 coupled to the failure processors 24. In one embodiment, the failure processors 24 are realized as microprocessors, although any other suitable type of processor or computer may be employed. The failure processors 24 each have a data port 26 coupled to a common bus 28. The common bus 28 is coupled through the connector 18 to the automated tester 12. Each of the failure processors 24 can recognize and individually respond to commands directed to that failure processor 24, avoiding bus contention issues and allowing the automated tester 12 to sequentially select specific failure processors 24 for tasks such as downloading data.

Each failure processor 24 also includes one or more data ports 30 coupling respective socket mounted memory devices 10 to the failure processor 24 through a respective one of the dedicated buses 14. Each failure processor 24 writes data to the memory devices 10 that are being tested, and then collects read data from each of the memory devices 10. The failure processors 24 then compare the read data to corresponding expect data to obtain failure data for each memory device 10. The failure data may then be made available to the automated tester through the common bus 28. Thus, the task of comparing read data to expect data may be carried out in real time, and the quantity of data associated with each memory device 10 is reduced before data are returned to the automated tester 12. As a result, the fanout capabilities are greatly expanded for the automated tester 12, despite limitations on the number of pins that may be included in each of the connectors 18. It will be appreciated that, while the failure processor 24 is illustrated in FIG. 2 as being mounted on the same test circuit board 22 as the memory devices 10, the failure processors 24 and the memory devices 10 may be coupled in any fashion permitting data to be coupled between them by the bus 14.

In one embodiment, the failure processors 24 then carry out further analysis of the failure data when appropriate, e.g., in speed grading or the like, providing post-analysis datasets that are even more compact than the failure data. The distributed, real-time processing carried out by the failure processors 24 results in shorter test times and reduced demands on the automated tester 12, providing additional cost reductions and increased throughput in testing of the memory devices 10.

Figure 3:
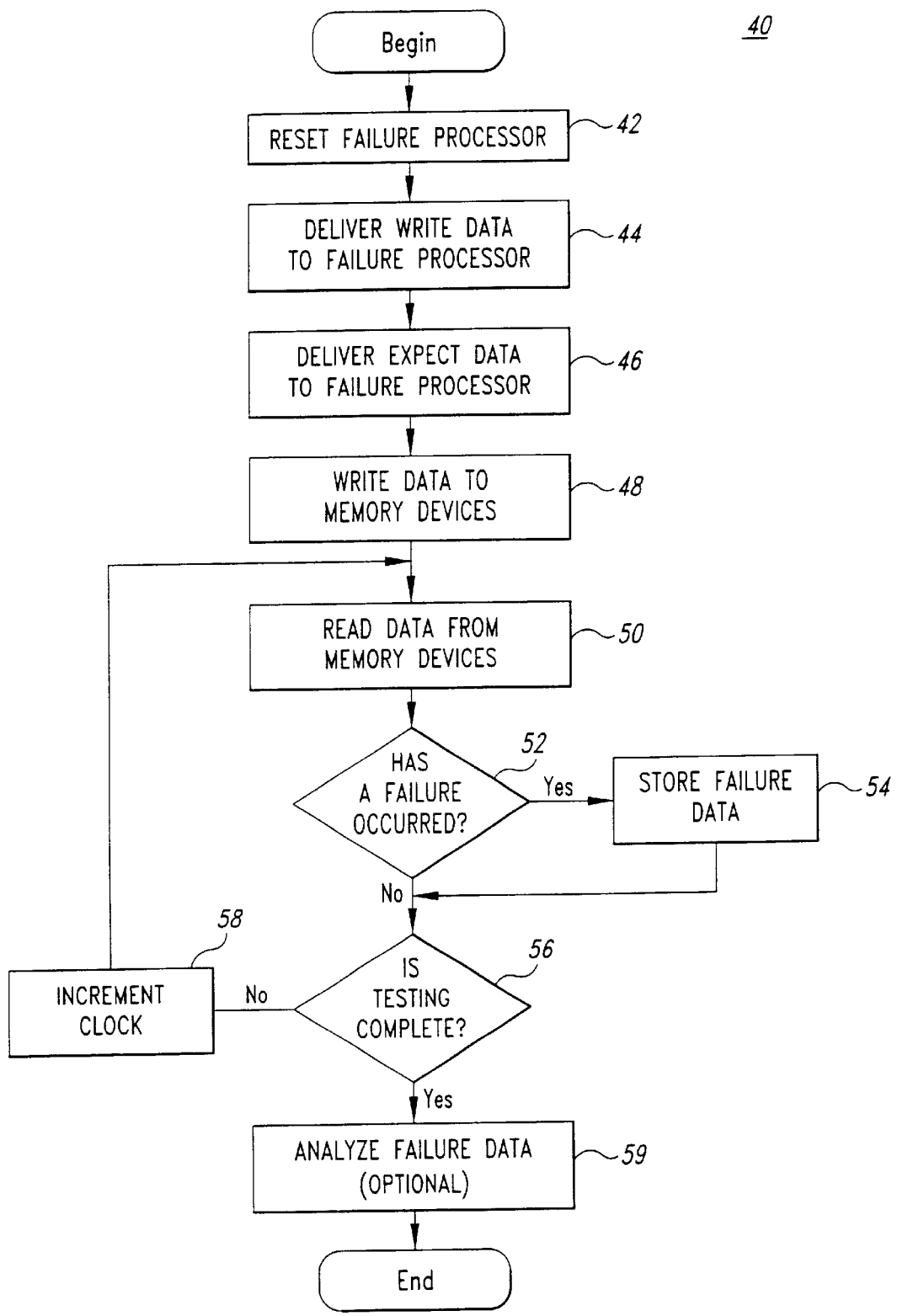
FIG. 3 is a flow chart of a process for testing of memory devices using the test circuit board and failure processors of FIG. 2 in accordance with an embodiment of the present invention.

FIG. 3 is a flow chart of a process 40 for controlling the failure processor 24 of FIG. 2 and using the test circuit board 22 to test memory devices 10 in accordance with an embodiment of the present invention. In the event a microprocessor is used as the failure processor 24, software for controlling the operation of the microprocessor can easily be derived from the flowchart of the process 40 shown in FIG. 3. The process 40 tests functionality of the memory device 10 and may use the automated tester 12 to do so, although it will be recognized that other types of controllers might be used. In a step 42, the automated tester 12 sends control signals through the common bus 28 to reset the failure processors 24. In a step 44, the automated tester 12 couples data that will be written to the memory devices 10 to the failure processors 24, again through the common bus 28. In a step 46, the automated tester 12 writes the expect data into all of the failure processors 24 using the common bus 28. The expect data may be the same as the write data, thus making this step 46 unnecessary, and it may therefore be omitted.

In a step 48, the failure processors 24 write data to the memory devices 10 through the dedicated buses 14. It will be appreciated that the step 46 may precede or follow either of the steps 44 and 48. In a step 50, the failure processors 24 collect the read data from the memory devices 10. In a query task 52, the failure processors 24 compare the read data to the corresponding expect data to determine if a failure has occurred in one or more of the memory devices 10, i.e., the read data do not match the corresponding expect data. When one of the failure processors 24 determines in the query task 52 that a failure has occurred, the failure processor 24 initiates a step 54. In the step 54, the failure processor 24 stores data describing the failure. Control passes to a query task 56 when either the query task 52 determines that no failure of the memory devices 10 has occurred or after the failure data have been recorded in the step 54. The query task 56 determines if the testing is complete.

When the query task 56 determines that the testing is not complete, the memory devices 10 and the failure processor 24 are incremented in step 58 to provide new read and expect data, respectively. The failure processor 24 then returns to the step 50 (or the step 48, as appropriate) and continues testing the memory devices 10. When the query task 56 determines that the testing is complete, control passes to an optional step 59. In the optional step 59, the failure data are analyzed to provide a post-analysis dataset. The process 40 then ends and the memory devices 10 are removed from the sockets on the test circuit board 22.

It will be appreciated that other embodiments are possible. For example, the write data and expect data may be provided by the failure processors 24 or by ROMs 25 coupled to the failure processors 24, in response to commands from the automated tester 12.

Figure 4:
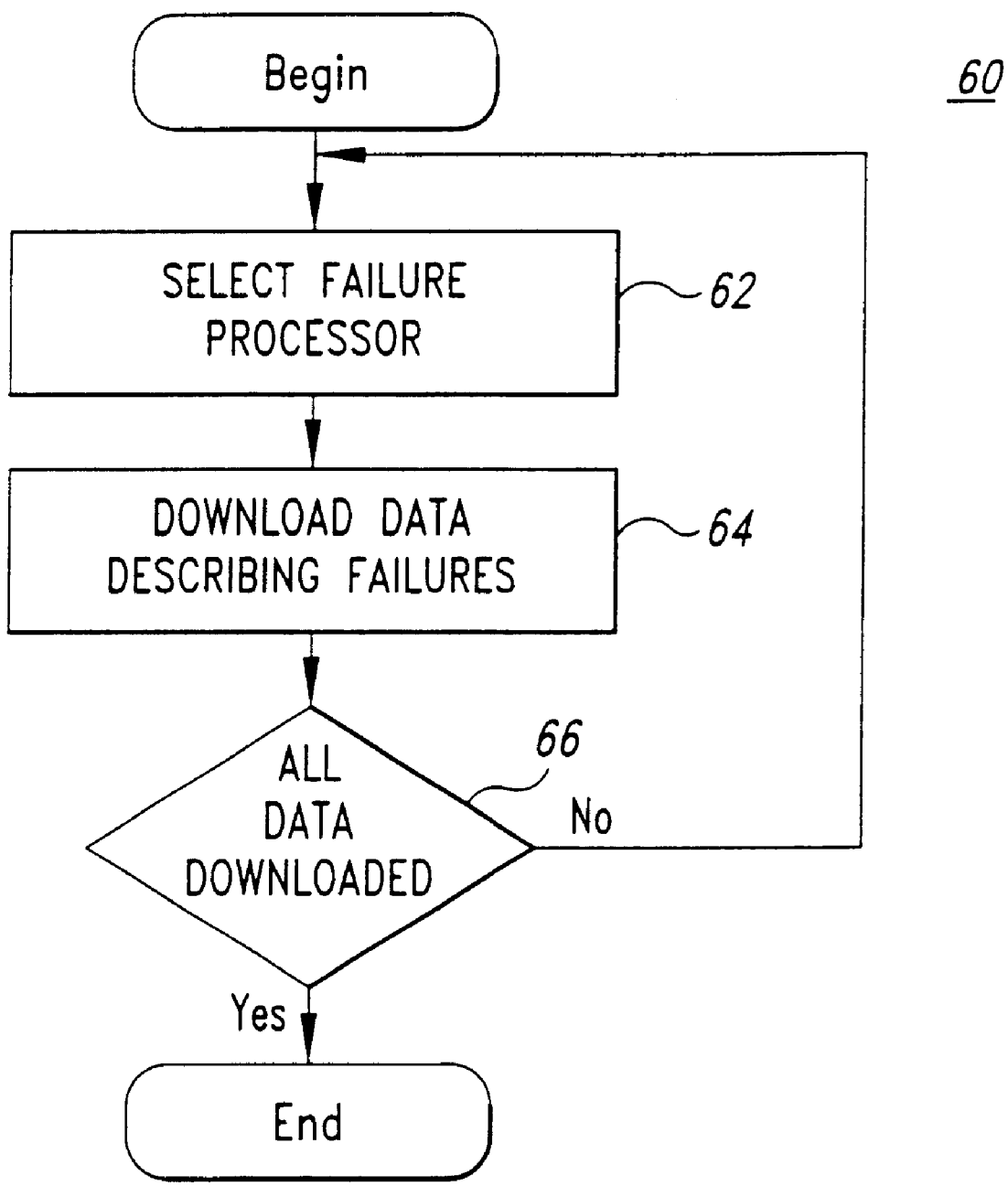
FIG. 4 is a flow chart of a process for downloading data from the failure processors of FIG. 2 in accordance with an embodiment of the present invention.

FIG. 4 is a flow chart of a process 60 for downloading data from the failure processors 24 of FIG. 2 in accordance with an embodiment of the present invention. In one embodiment, the automated tester 12 (FIG. 2) may initiate the process 60 after the process 40 (FIG. 3) ends. In a step 62, one of the failure processors 24 that has new data to be downloaded is selected. In one embodiment, a signal is coupled to the selected failure processor 24 from the automated tester 12 through the common bus 28 (FIG. 2).

In another embodiment, the failure processors 24 may initiate the process 60 each time a failure occurs, or, alternatively, each time the failure processor 24 has accumulated data relevant to a predetermined number of failures. In yet other embodiments, the failure processors 24 may initiate the process 60 when the failure processors 24 reach a predetermined data storage capacity or after analyzing the failure data. In these embodiments, the failure processor 24 executes the step 62 by sending an interrupt to the automated tester 12 through the common bus 28 (FIG. 2).

In a step 64, the selected failure processor 24 downloads data describing the failure status of the memory devices 10 to the automated tester 12 through the common bus 28. A query task 66 then determines if all of the data from the failure processor 24 have been downloaded. When the query task 66 determines that not all of the failure data have been downloaded, control passes back to step 62 to select another one of the failure processors 24, allowing all of the failure processors 24 to be selected in turn. When the query task 66 determines that all of the data from the failure processors 24 have been downloaded, or that all of the data from a failure processor 24 that had initiated the process 60 has been downloaded, the process 60 ends.

Figure 5:
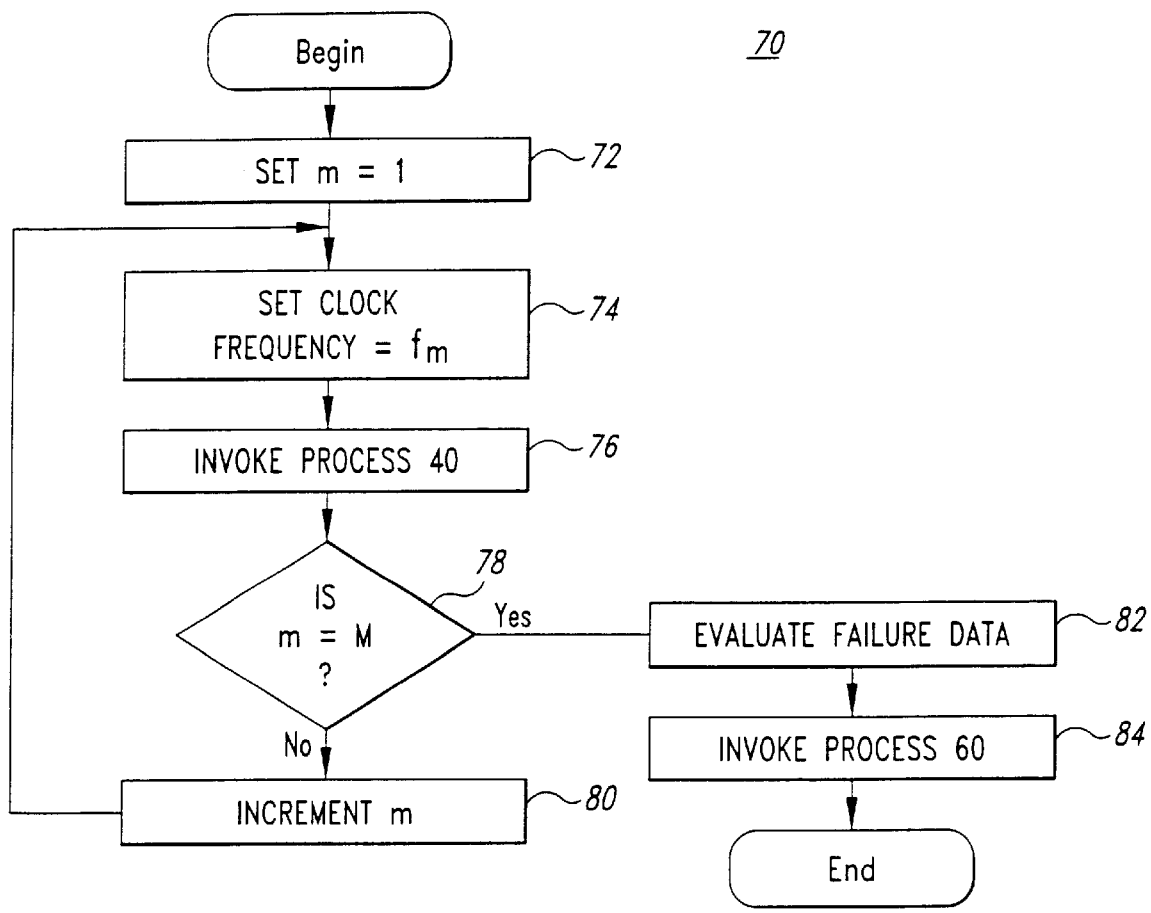
FIG. 5 is a flow chart of a process for speed grading of memory integrated circuits using the test circuit board and failure processors of FIG. 2 in accordance with an embodiment of the present invention.
Figure 6:
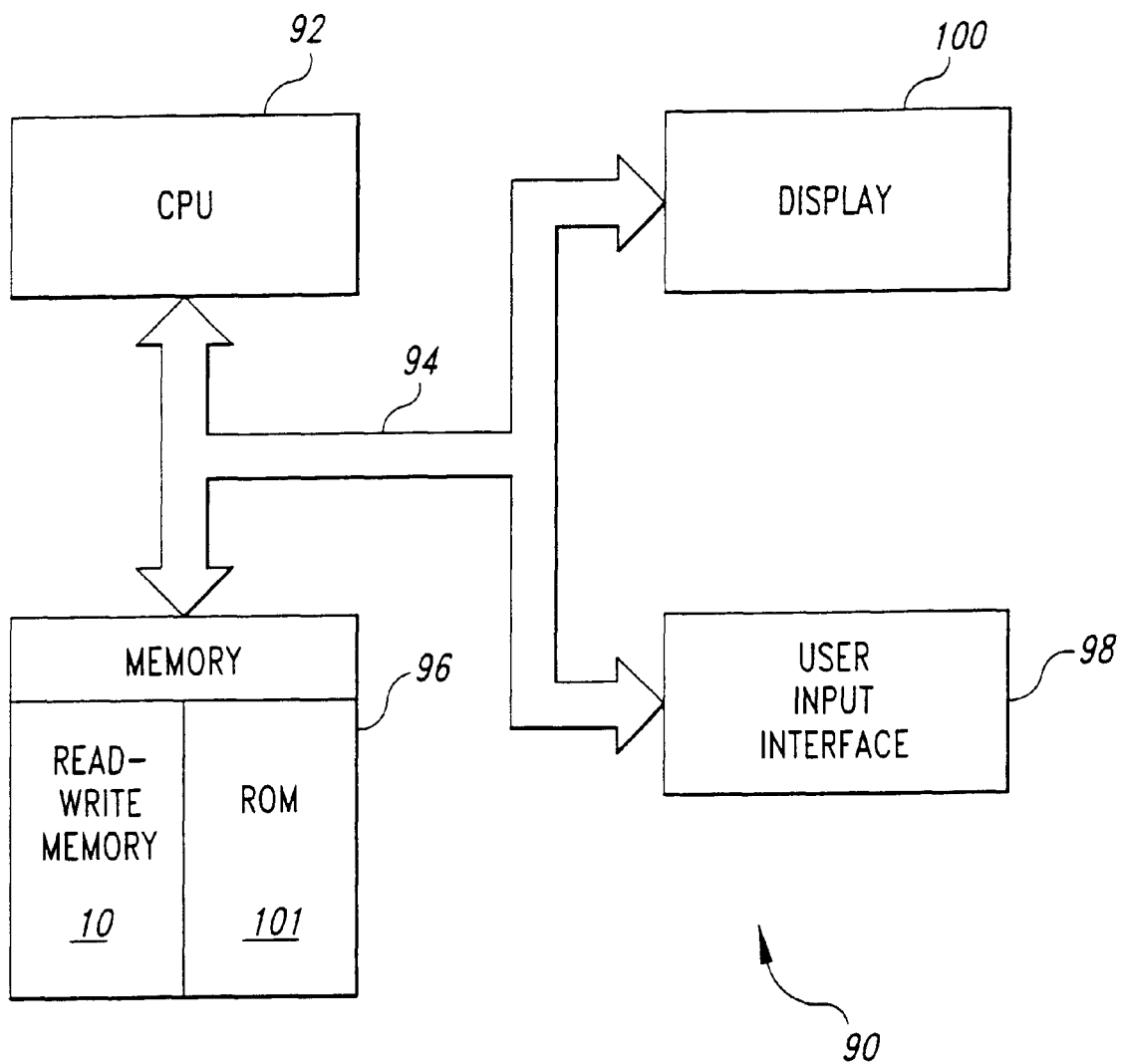
FIG. 6 is a block diagram of a computer system in accordance with an embodiment of the present invention.

FIG. 5 is a flow chart of a process 70 for governing the failure processors 24 of FIG. 2 to control the manner in which speed grading memory devices 10 is accomplished using the test circuit board 22 in accordance with an embodiment of the present invention. Again, if the failure processor 24 is implemented using a microprocessor, the flowchart of the process 70 can be used to derive software controlling the operation of the microprocessor. It will be understood that the steps in the process 70 may be carried out by the automated tester 12 or the failure processors 24 or a combination thereof. The speed grading process 70 tests a group of memory devices 10 at M many different clock frequencies to determine a maximum clock frequency for reliable operation of each of the memory devices 10. In a step 72, an index variable m is set to 1. In a step 74, a clock signal that is coupled to the memory device 10 of FIG. 2 is set to an $m^{TH}$ clock frequency $f_m$. In a step 76, the process 40 of FIG. 3 is invoked.

A query task 78 then determines if m=M. When m≠M, a step 80 increments m and control passes back to the step 74. When m=M, a step 82 is executed by the failure processor 24. In the step 82, failure data for each of the memory device 10 are evaluated to determine a maximum clock frequency for each of the memory devices 10 to be able to operate reliably. For example, assuming that the clock frequencies $f_m$ are arranged in ascending order, if a memory device 10 provides no failures for clock frequencies $f_1$, $f_2$ and $f_3$ and provides some failures for a clock frequency $f_4$ and more failures for a clock frequency $f_5$, the maximum clock frequency for reliable operation of the memory device 10 will be less than that of the clock frequency $f_4$. A step 84 invokes the process 60 of FIG. 4 to download stored post-processing datasets from the failure processors 24 to the automated tester 12. The process 70 then ends.

In one embodiment, when the process 70 invokes the process 40 of FIG. 3, the optional step 59 ("analyze failure data") may not be required. One reason for this is that the step 54 may only require incrementing a counter or setting a flip-flop, i.e., each invocation of the process 40 results in data indicative of a lower bound of a number of failures measured by the process 40.

Speed grading of integrated circuits (e.g., the process 70 of FIG. 5) differs from functional testing (e.g., the process 40 of FIG. 3). One reason for this is that speed grading is typically carried out with integrated circuits that have previously been tested and that are therefore known to be functional. In the case of memory devices 10 that are read-write memories, such as DRAMs, the memory devices 10 have previously been tested and defective memory cells have previously been replaced, as is conventional.

Accordingly, speed grading for memory devices 10 may not require the identification of the addresses for memory cells that fail, and may instead require only a determination of a total number of failures at each clock frequency. When only a determination of the total number of failures is required, the failure processor 24 may include a counter to count failures. When only an indication that one or more failures has occurred is required, the failure processor 24 may only need to set a flag or a flip flop at each clock frequency. Circumstances such as these may permit simplification of the failure processor 24 and may permit use of data compression.

In one embodiment, the memory devices 10 may be part of a module that includes one or more of the failure processors 24, or the failure processors 24 may be integrated into the memory devices 10. This embodiment is particularly useful because it allows the read-write memory 10 to be tested more rapidly, e.g., using the process 40 of FIG. 3.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. A system for testing a plurality of integrated circuits mounted on a common substrate, the substrate having a first signal port adapted to be coupled to a testing device, the testing system comprising one or more failure processors mounted on the substrate, each failure processor having a second signal port coupled to the first signal port, and a plurality of test ports corresponding in number to the number of integrated circuits mounted on the substrate that are to be tested by that failure processor, each of the test ports being coupled to a respective one of the integrated circuits, each failure processor being constructed to apply stimulus signals to each of the integrated circuits and to record response signals generated by each of the integrated circuits in response to the stimulus signals provided to the integrated circuits, each failure processor further being constructed to provide report data based on the response signals and to couple the report data from the second signal port to the first signal port.

2. The testing system of claim 1 wherein the integrated circuits are detachably coupled to sockets mounted on the substrate.

3. The testing system of claim 1 wherein each of the integrated circuits comprise integrated circuit memory devices, wherein the stimulus signals comprise addresses, control signals, and write data stored in the integrated circuit memory devices in response to the control signals at locations designated by the addresses, and the response signals comprise read data received from each of the integrated circuit memory devices.

4. The testing system of claim 3 wherein each failure processor is constructed to compare the write data to the read data, determine each address for which the read data differs from the write data, and to provide as the report data information indicative of the addresses for which the read data differs from the write data.

5. The testing system of claim 3 wherein each failure processor is further constructed to analyze the integrated circuit memory devices on the basis of the write data and the read data, and to provide as the report data information indicative of a parameter of each of the integrated circuit memory devices obtained from the analysis.

6. The testing system of claim 1 wherein the number of integrated circuit devices mounted on the substrate are two in number.

7. The testing system of claim 1 wherein the failure processor is coupled to the integrated circuits through separate buses so that the failure processor can simultaneously receive the response signals from a plurality of the integrated circuits.

8. The testing system of claim 1 wherein the substrate comprises a printed circuit board, and wherein the first signal port comprises a connector mounted on the printed circuit board.

9. The testing system of claim 1 wherein each failure processor comprises:

a microprocessor having a data bus through which the microprocessor is coupled to the integrated circuits and the first signal port; and a memory unit operably coupled to the microprocessor, the memory unit storing instructions for execution by the microprocessor, and data corresponding to the response signals from the integrated circuits.

10. The testing system of claim 9 wherein the memory unit comprises:

a read/write memory constructed to store the data corresponding to the response signals; and a read only memory constructed to store the instructions for execution by the microprocessor.

11. The testing system of claim 1 wherein each failure processor is operable to simultaneously apply the stimulus signals to all of the integrated circuits that are to be tested by that failure processor.

12. The testing system of claim 1 wherein each failure processor is operable to simultaneously receive the response signals from all of the integrated circuits that are to be tested by that failure processor.

13. A failure processor for testing a plurality of integrated circuits mounted on a common substrate along with the failure processor, the failure processor having a signal port adapted to be coupled to a testing device, the failure processor being coupled to each of integrated circuits mounted on the substrate that are to be tested, the failure processor comprising:

means for applying stimulus signals to each of the integrated circuits;

means for recording response signals generated by each of the integrated circuits in response to the stimulus signals provided to the integrated circuits;

means for providing report data based on the response signals; and means for coupling the report data from the failure processor to the signal port.

14. The failure processor of claim 13, wherein each of the integrated circuits comprise integrated circuit memory devices, wherein the means for applying stimulus signals comprises means for applying addresses, control signals, and write data to the memory devices to store the write data in the integrated circuit memory devices in response to the control signals at locations designated by the addresses, and wherein the response signals comprise read data received from each of the integrated circuit memory devices.

15. The failure processor of claim 14 wherein the failure processor further comprises:
   means for comparing the write data to the read data;
   means for determining each address for which the read data differs from the write data; and
   means for providing as the report data information indicative of the addresses for which the read data differs from the write data.

16. The failure processor of claim 14 further comprising:
   means for analyzing the integrated circuit memory devices on the basis of the write data and the read data; and
   means for providing as the report data information indicative of a parameter of each of the integrated circuit memory devices obtained from the analysis.

17. The failure processor of claim 13 wherein the number of integrated circuits mounted on the substrate are two in number.

18. The failure processor of claim 13 wherein the failure processor is coupled to the integrated circuits through separate buses so that the failure processor can simultaneously receive the response signals from a plurality of the integrated circuits.

19. The failure processor of claim 13 wherein the substrate comprises a printed circuit board, and wherein the signal port comprises a connector mounted on the printed circuit board.

20. The failure processor of claim 13 wherein the means for applying stimulus signals comprises means for simultaneously applying the stimulus signals to all of the integrated circuits that are to be tested.

21. The failure processor of claim 13 wherein the failure processor is operable to simultaneously receive the response signals from all of the integrated circuits that are to be tested.

22. The failure processor of claim 13 wherein the means for recording response signals comprises means for simultaneously recording the response signals generated by each of the integrated circuits.

* * * * *

UNITED STATES PATENT AND TRADEMARK OFFICE
CERTIFICATE OF CORRECTION

PATENT NO. : 6,581,172 B2
DATED : June 17, 2003
INVENTOR(S) : Robert L. Totorica and Charles K. Snodgrass It is certified that error appears in the above-identified patent and that said Letters Patent is hereby corrected as shown below:

Column 1,
Line 29, reads "the time require" should read -- the time required --
Line 40, reads "when the date that is read" should read -- when the data that is read --

Column 2,
Line 18, reads "at the same time." should read -- at the same time, --
Line 37, reads "cost of testing in further" should read -- cost of testing is further --
Line 54, reads "that an be made" should read -- that can be made --

Column 3,
Line 27, reads "from the compresses" should read -- from the compressed --

Column 4,
Line 22, reads "devices mounted" should read -- devices 10 mounted --

Column 6,
Line 50, reads "of the memory device" should read -- of the memory devices --

Signed and Sealed this

Fifteenth Day of June, 2004

JON W. DUDAS
*Acting Director of the United States Patent and Trademark Office*